(12) United States Patent
Liao et al.

(10) Patent No.: US 12,084,762 B2
(45) Date of Patent: Sep. 10, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Ker-hsun Liao, Hsinchu (TW); Wei-Ming Wang, Hsinchu (TW); Yen-Hsing Chen, Hsinchu (TW); Lun-Kuang Tan, Hsinshu (TW); Yi Chen Ho, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/662,958

(22) Filed: May 11, 2022

(65) Prior Publication Data
US 2023/0366081 A1    Nov. 16, 2023

(51) Int. Cl.
*C23C 16/44* (2006.01)
*B08B 9/032* (2006.01)
*B08B 9/08* (2006.01)
*B08B 13/00* (2006.01)
*G05B 13/02* (2006.01)
(Continued)

(52) U.S. Cl.
CPC ........ *C23C 16/4405* (2013.01); *B08B 9/0325* (2013.01); *B08B 9/08* (2013.01); *B08B 13/00* (2013.01); *G05B 13/0265* (2013.01); *G05D 23/22* (2013.01); *B08B 2209/032* (2013.01); *B08B 2209/08* (2013.01); *H01L 21/0214* (2013.01); *H01L 21/02271* (2013.01); *H01L 29/66795* (2013.01)

(58) Field of Classification Search
CPC ................................................ C23C 16/4405
See application file for complete search history.

(56) References Cited

U.S. PATENT DOCUMENTS 5,565,038 A * 10/1996 Ashley ...................... B08B 3/08
                                                    134/21
2006/0042544 A1* 3/2006 Hasebe ............... C23C 16/4412
                                                    134/1
(Continued)

FOREIGN PATENT DOCUMENTS

WO   WO-2004070802 A1 * 8/2004 ......... C23C 16/4405

OTHER PUBLICATIONS

Machine translation: WO 2004/070802; Hasebe et al. (Year: 2004).*

*Primary Examiner* — Natasha N Campbell
(74) *Attorney, Agent, or Firm* — Harrity & Harrity, LLP

(57) ABSTRACT

Some implementations described herein provide techniques and apparatuses for determining a performance of a dry-clean operation within a deposition tool. A cleaning-control subsystem of the deposition tool may include a gas concentration sensor and a temperature sensor mounted in an exhaust system of the deposition tool to monitor the dry-clean operation. The gas concentration sensor may provide data related to a concentration of a chemical compound in a cleaning gas, where the chemical compound is a bi-product of the dry-clean operation. The temperature sensor may provide temperature data related to an exothermic reaction of the dry-clean operation. Such data may be used to determine an efficiency and/or an effectiveness of the dry-clean operation within the deposition tool.

20 Claims, 14 Drawing Sheets

(51) Int. Cl.
    *G05D 23/22*     (2006.01)
    *H01L 21/02*     (2006.01)
    *H01L 29/66*     (2006.01)

(56) References Cited

U.S. PATENT DOCUMENTS

2010/0154835 A1* 6/2010 Dimeo ................ C23C 16/4405
                                                    134/31
2013/0164943 A1* 6/2013 Koshi .................... C23C 16/24
                                                    118/712
2022/0037137 A1* 2/2022 Chen ................ H01J 37/32981

* cited by examiner

SEMICONDUCTOR PROCESSING TOOL AND METHODS OF OPERATION

BACKGROUND

A deposition tool, such as a thin-film furnace, includes a semiconductor processing tool that performs a deposition operation within a processing chamber to form a layer of a material over another layer of material on a semiconductor substrate. For example, the thin-film furnace may form a layer of a silicon oxycarbonnitride (SiCON) material over a layer of a silicon dioxide ($SiO_2$) material. In some implementations, the thin-film furnace includes a gas distribution system that injects a gas into the processing chamber to perform the deposition operation. The gas distribution system may also inject a cleaning gas into the processing chamber to perform a cleaning operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
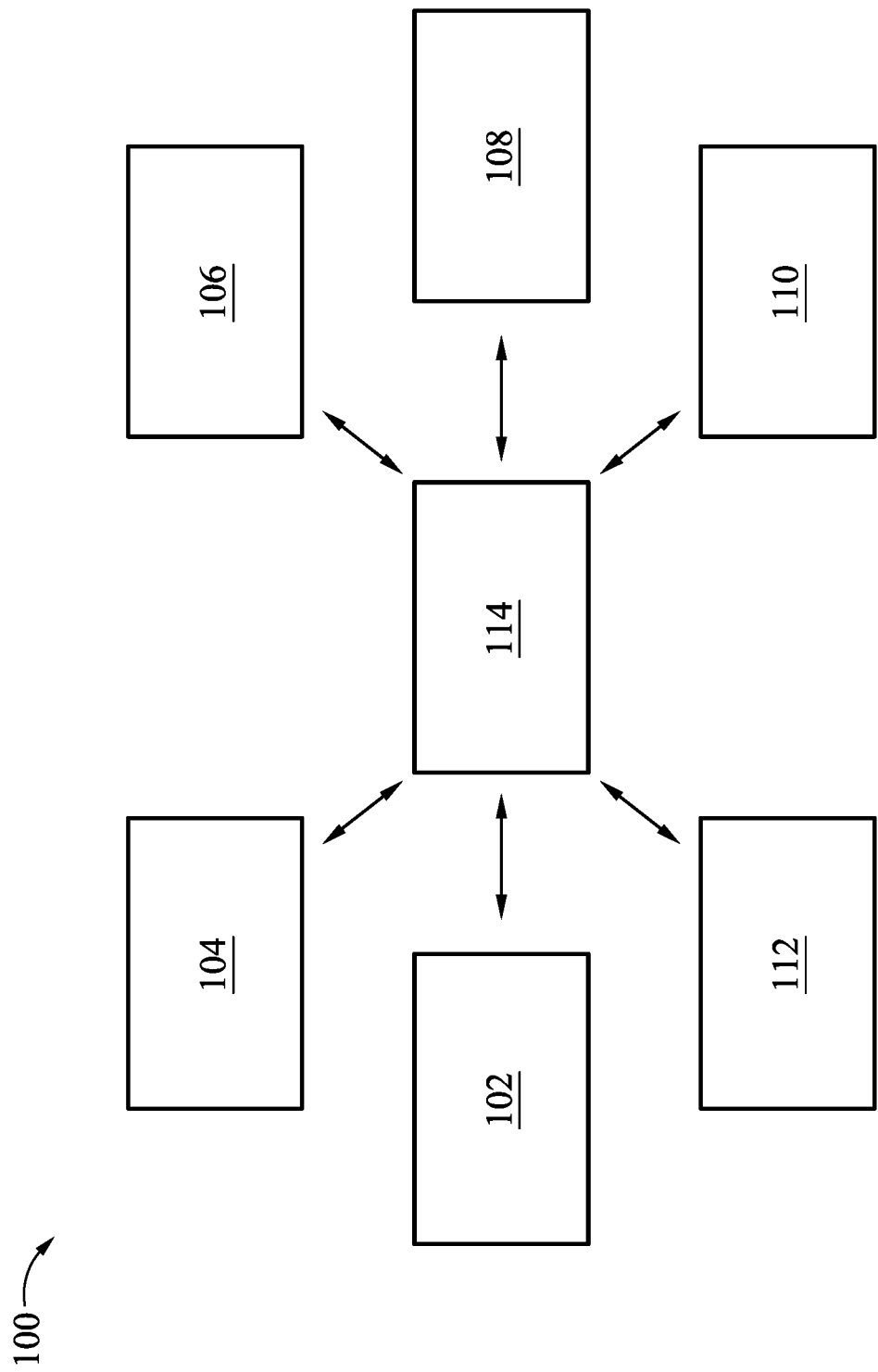
FIGS. 1A-1C are diagrams of an example semiconductor processing environment including a deposition tool having a cleaning-control subsystem described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin-based transistors, such as fin field effect transistors (finFETs), may be fabricated using a combination of semiconductor processing tools, including a thin-film furnace. For example, a layer of a silicon oxynitride ($SiO_xN_y$) material may be deposited over a fin structure of the finFET using the thin-film furnace. To maintain cleanliness in the thin-film furnace and reduce contamination to semiconductor product fabricated using the thin-film furnace, a dry-clean operation may be used to remove thin-film materials that may have accumulated on interior surfaces of the thin-film furnace.

Techniques to monitor a performance of the dry-clean operation may include using a quartz test piece coated with a test film. For example, the performance may correspond to an efficiency of the dry-clean operation (e.g., a rate at which a cleaning gas removes, or etches, the test film from the quartz test piece) and/or an effectiveness of the dry-clean operation (e.g., an amount of residual test film remaining on the quartz test piece taken at one or more read points of the dry-clean operation). However, the techniques using the quartz test piece may require multiple read points, consume an inordinate amount of time, and waste cleaning gases. Furthermore, correlating removal of the test film from the quartz test piece to a cleanliness of the thin-film furnace may be inaccurate, leading to an overcleaning of the thin-film furnace and possible damage to the thin-film furnace.

Some implementations described herein provide techniques and apparatuses for determining a performance of a dry-clean operation within a deposition tool. A cleaning-control subsystem of the deposition tool may include a gas concentration sensor and a temperature sensor mounted in an exhaust system of the deposition tool to monitor the dry-clean operation. The gas concentration sensor may provide data related to a concentration of a chemical compound in a cleaning gas, where the chemical compound is a bi-product of the dry-clean operation. The temperature sensor may provide temperature data related to an exothermic reaction of the dry-clean operation. Such data may be used to determine an efficiency and/or an effectiveness of the dry-clean operation within the deposition tool.

In this way, an accuracy of a performance of the dry-clean operation within the deposition tool is increased, resulting in an improved yield of semiconductor product fabricated using the deposition tool. Additional benefits include a decrease in a consumption of cleaning gases to save costs, and a decrease in a downtime related to cleaning the deposition tool to increase a throughput of semiconductor product fabricated using the deposition tool.

Figure 1B:
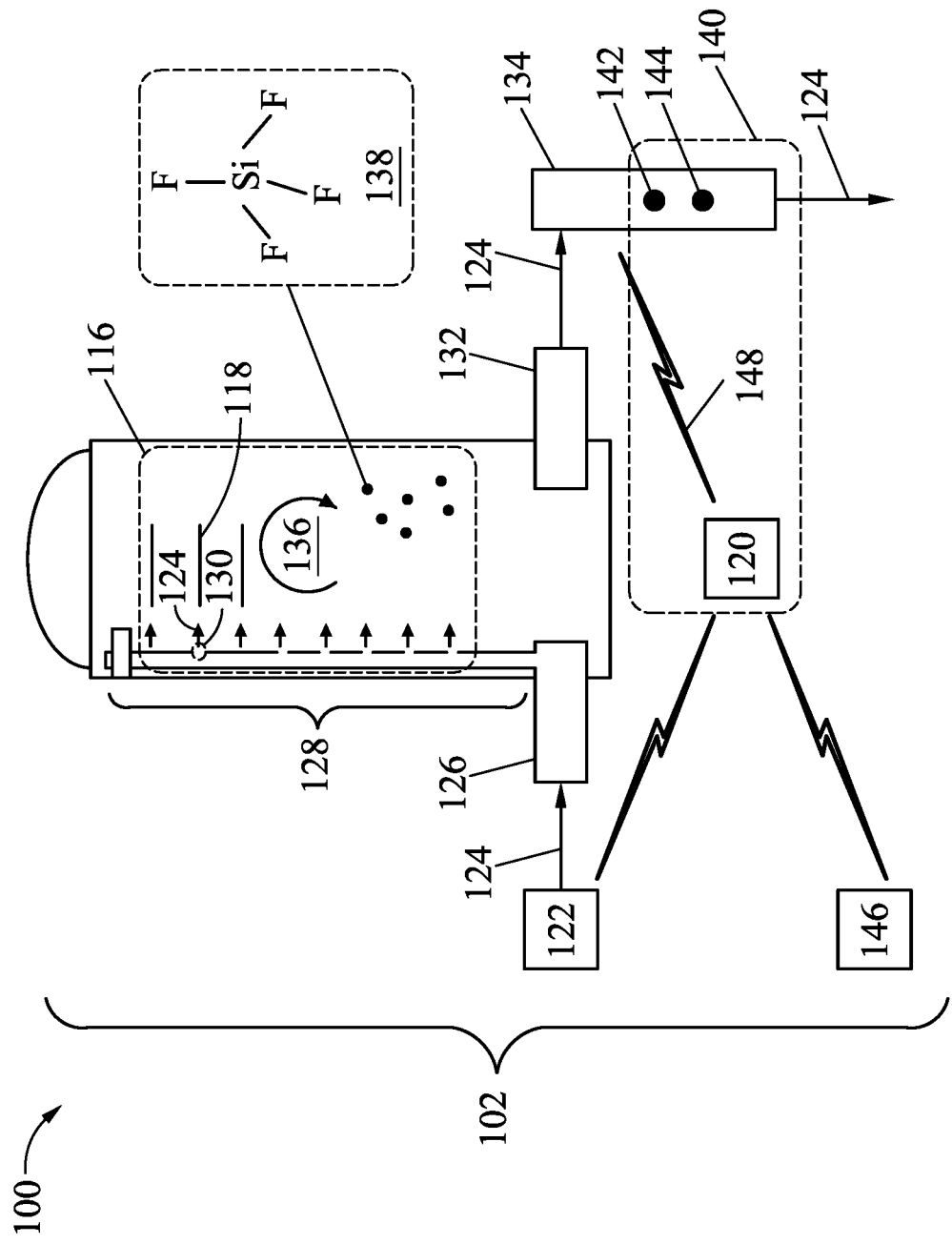
Figure 1C:
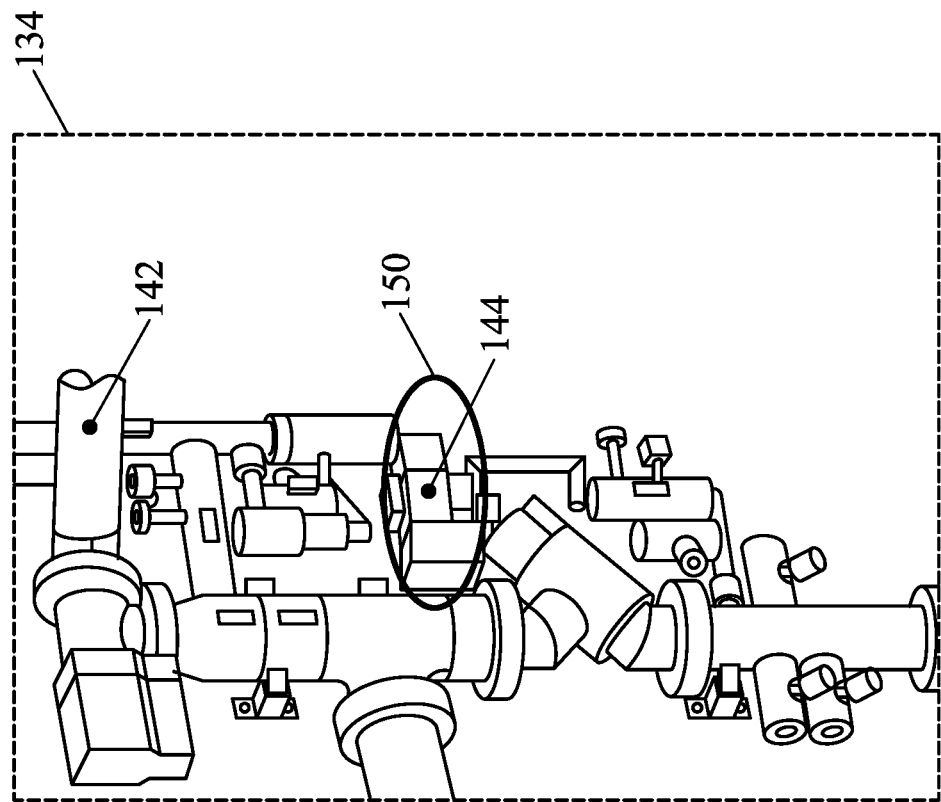

FIGS. 1A-1C are diagrams of an example semiconductor processing environment 100 including a deposition tool described herein. As shown in FIG. 1A, environment 100 may include a plurality of semiconductor processing tools 102-112 and a wafer/die transport tool 114

The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the deposition chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated material handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 includes a programmed device that is configured to travel a particular path and/or may operate semi-autonomously or autonomously. In some implementations, the semiconductor processing environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, or processing chambers for performing different types of deposition operations, among other examples). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B shows an example implementation of the deposition tool 102. The deposition tool 102 of FIG. 1B may correspond to a thin-film furnace that includes a processing chamber 116. As described in connection with FIGS. 3A-3D, the deposition tool 102 may perform a CVD process or an ALD process to deposit a layer of material (e.g., a thin-film material such as a silicon oxycarbonnitride (SiCON) material or over a layer of a silicon dioxide (SiO$_2$) material on a semiconductor substrate 118 (e.g., wafer) within the processing chamber 116). However, other combinations and types of deposition tools, processing chambers, deposition processes, or materials are within the scope of the present disclosure.

As shown in FIG. 1B, the deposition tool 102 includes a gas distribution system. The gas distribution system includes a controller 120 communicatively coupled to a gas source 122 (e.g., a source of a cleaning gas 124 for a cleaning operation, or a source of a precursor gas for a deposition operation, among other examples). The controller 120 (e.g., a processor, a combination of a processor and memory, among other examples) may communicate with the gas source 122 (e.g., a valve controlling a flow of gas from a tank or reservoir, or a valve controlling flows of multiple types of gases from multiple gas supply lines, among other examples) to activate a flow of the cleaning gas 124, change a rate of the flow of the cleaning gas 124 from the gas source 122, or to change a mixture of the flow of the cleaning gas 124 from the gas source 122.

The gas distribution system includes a gas inlet 126 that passes through an interior wall of the processing chamber 116. The gas distribution system further includes an injector nozzle 128 that is elongated along a path that is approximately parallel to the interior wall.

The injector nozzle 128 includes gas outlets 130 configured to provide the flow of the cleaning gas 124 received from the gas inlet 126 into the processing chamber 116. The injector nozzle 128 may include a quartz material or a stainless steel material, among other examples. At least one of the gas outlets 130 may face away from the interior wall and towards the semiconductor substrate 118. In some implementations, the gas outlets 130 may include a linear array of the gas outlets 130 spaced along the injector nozzle 128.

The gas distribution system further includes a gas outlet 132. The flow of the cleaning gas 124 may exit the processing chamber 116 through the gas outlet 132 and into a foreline 134 (e.g., an exhaust system including a combination of one or more vacuum lines) of the deposition tool 102.

In some implementations, a dry-clean operation 136 (e.g., a dry-clean operation corresponding to an etching operation) may be performed to remove deposits and/or residual thin-film materials from an interior surface of the deposition chamber 116 and/or the injector nozzle 128. The deposition tool 102 may perform the dry-clean operation 136 using a dry-clean recipe. In some implementations, the dry-clean recipe indicates one or more of a type of the cleaning gas 124 (e.g., a fluorine (F$_2$) gas), a flow rate of the cleaning gas 124 (e.g., liters per minute), a pressure of the cleaning gas 124 (e.g., kilopascals), or a temperature (e.g., degrees Celsius) of the cleaning gas 124, among other examples. In some implementations, the dry-clean recipe corresponds to a dry-clean recipe that is effective in cleaning the deposition chamber 116. In some implementations, the dry-clean recipe corresponds to a dry-clean recipe that is effective in cleaning the injector nozzle 128.

The dry-clean operation 136 may, due to a reaction of the cleaning gas 124 with the deposits and/or residual thin-film materials within the deposition tool 102, generate a chemical compound 138. For example, an F$_2$ gas may react with a deposit or a residual thin-film including an SiCON material or an SiO$_2$ material to generate a silicon tetrafluoride (SiF$_4$) chemical compound. A concentration (e.g., parts per million) of the chemical compound 138 in the cleaning gas 124, exiting the gas outlet 132 and entering the foreline 134, may indicate an effectiveness and/or an efficiency of the dry-clean operation 136 (e.g., a concentration of less than approximately 20 parts per million may indicate the dry-clean operation 136 is complete, while a concentration at or near approximately 2500 parts per million may indicate the dry-clean operation 136 is actively removing the deposits and/or residual thin film materials, among other examples).

Additionally, or alternatively, the reaction of the cleaning gas 124 with the materials of the deposits and/or residual thin-film materials within the deposition tool 102 may generate an exothermic reaction. In such a case, a temperature of the cleaning gas 124, exiting the gas outlet 132 and entering the foreline 134, may correspond to an effectiveness and/or efficiency of the dry-clean operation (e.g., a temperature of the cleaning gas 124 at or near approximately 80 degrees Celsius may indicate a the dry-clean operation 136 is complete, while a temperature of the cleaning gas at or near 140 degrees Celsius may indicate that the dry-clean operation 136 is actively removing the deposits and/or thin film materials, among other examples).

To monitor an efficiency and/or effectiveness of the dry-clean operation 136, the deposition tool 102 includes a cleaning-control subsystem 140. In addition to the controller 120, the cleaning-control subsystem 140 includes a temperature sensor 142 and a gas concentration sensor 144.

The temperature sensor 142 may correspond to a k-type thermocouple that is mounted in a first portion of the foreline 134, among other examples. The temperature sensor 142 may monitor a temperature of the cleaning gas 124 passing through the foreline 134. The temperature sensor may include a capability to detect a temperature of the cleaning gas 124 to within a range of approximately +/−1 degree Celsius. However, other values and ranges for the capability of the temperature sensor 142 to detect the temperature of the cleaning gas 124 are within scope of the present disclosure.

The gas concentration sensor 144 may correspond to a non-dispersive infrared (NDIR) sensor that is mounted to a second portion the foreline 134, among other examples. The gas concentration sensor 144 may detect a concentration of the chemical compound 138 in the cleaning gas 124 passing through the foreline 134. As an example, the gas concentration sensor 144 may include a capability to detect the concentration of the chemical compound 138 in a range of up to approximately 5000 parts per million. However, other values and ranges for the capability for the gas concentration sensor 144 to detect the concentration of the chemical compound 138 are within the scope of the present disclosure.

In some implementations, the deposition tool 102 includes a notification system 146. The notification system 146 may include a visual component (e.g., a status indicator light or a graphical user interface, among other examples) and/or an audio component (e.g., a speaker or a buzzer, among other examples). The notification system 146 may indicate, to a maintenance engineer and/or an operator of the deposition tool 102, a status of the dry-clean operation 136 (e.g., indicate that the dry-clean operation 136 is active or complete).

The controller 120 may communicatively couple to one or more of the gas source 122, the temperature sensor 142, the gas concentration sensor 144, or the notification system 146 using one or more communication links 148 (e.g., one or more wireless-communication links, one or more wired-communication links, or a combination of a wireless-communication link and a wired-communication link, among other examples). Using the one or more communication links 148, the controller 120 may exchange signals (e.g., signals carrying commands, information, or data content, among other examples) with one or more of the gas source 122, the temperature sensor 142, the gas concentration sensor 144, or the notification system 146. The signals may include individual signals, combinations or sequences of signals, analog signals, digital signals, digital communications, and/or other types of signals.

Although described as part of the deposition tool in FIG. 1B, in some implementations, the controller 120 may be separate from the deposition tool 102. Similarly, and although described as part of the from the deposition tool 102 in FIG. 1B, the notification system 146 may be separate from the deposition tool 102.

As an example implementation, and described in connection with FIGS. 2, 4A-4F, and elsewhere herein, the cleaning-control subsystem 140 includes the gas concentration sensor 144, the temperature sensor 142, and the controller 120. The controller 120 is configured to receive, from the gas concentration sensor 144, data corresponding to a concentration of the chemical compound 138 formed in the cleaning gas 124 during the dry-clean operation 136. The controller 120 is configured to receive, from the temperature sensor 142, data corresponding to a temperature of the cleaning gas 124. The controller 120 is configured to determine, based on the data corresponding to the concentration of the chemical compound 138 formed in the cleaning gas 124 and the data corresponding to the temperature of the cleaning gas 124, that the dry-clean operation 136 is complete. The controller 120 is configured to transmit, based on determining that the dry-clean operation 136 is complete, instructions to the notification system 146 to cause the notification system 146 to indicate that the dry-clean operation 136 is complete.

Additionally, or alternatively, the deposition tool 102 may correspond to a thin-film furnace. In such a case, the deposition tool 102 includes a deposition chamber (e.g., the deposition chamber 116) and the foreline 134 connected to a gas outlet (e.g., the gas outlet 132) of the deposition chamber. The deposition tool 102 includes an NDIR sensor (e.g., the gas concentration sensor 144) mounted to the foreline 134 and a thermocouple (e.g., the temperature sensor 142) mounted to the foreline 134. The deposition tool 102 includes the controller 120. The controller 120 is configured to activate the dry-clean operation 136. In some implementations, the dry-clean operation 136 forms a concentration of the chemical compound 138 in the cleaning gas 124. In some implementations, the cleaning gas 124 passes from the deposition chamber through the foreline 134. The controller 120 is configured to receive, from the NDIR sensor, data corresponding to the concentration of the chemical compound 138 in the cleaning gas 124. The controller 120 is configured to receive, from the thermocouple, data corresponding to a temperature of the cleaning gas 124. The controller 120 is configured to determine, based on the data corresponding to the concentration of the chemical compound 138 in the cleaning gas 124 and the data corresponding to the temperature of the cleaning gas 124, that the dry-clean operation 136 is complete. The controller 120 is configured to deactivate, based on determining that the dry-clean operation 136 is complete, the dry-clean operation 136.

The controller 120 may determine that the dry-clean operation 136 is complete using a machine learning model. The machine learning model may include and/or may be associated with one or more of a neural network, a random forest model, a clustering mode, or a regression model among other examples. In some implementations, the controller 120 uses the machine learning model to determine that the dry-clean operation 136 is complete by providing candidate dry-clean recipe parameters as input to the machine learning model, and using the machine learning model to determine a likelihood, probability, or confidence that a particular outcome (e.g., a level of cleanliness corresponding to amount of a buildup of a thin-film material within the deposition chamber 116 and/or the injector nozzle 128) for a subsequent recipe or type of the dry-clean operation 136 will be achieved using the candidate parameters. In some implementations, the controller 120 provides a level of cleanliness as input to the machine learning model, and the controller 120 uses the machine learning model to determine or identify a particular combination of a concentration of the chemical compound 138 in the cleaning gas 124 and or a temperature of the cleaning gas 124 that are likely to indicate the level of cleanliness.

The controller 120 (or another system) may train, update, and/or refine the machine learning model to increase the accuracy of the outcomes and/or parameters determined using the machine learning model. The controller 120 may train, update, and/or refine the machine learning model based on feedback and/or results subsequent to the dry-clean operation 136, as well as from historical operating conditions (e.g., from hundreds, thousands, or more historical or related dry-clean operations) performed by one or more of the deposition tool 102 including the cleaning-control subsystem 140. In some implementations, the feedback and/or results may include a yield of semiconductor product fabricated using the deposition tool 102 subsequent to the dry-clean operation 136. In some implementations, the machine learning model correlates one or more of the historical operating conditions to a level of cleanliness.

In some implementations, and as described in connection with FIGS. 2, 4A-4F, and elsewhere herein, the cleaning-control subsystem 140 may perform a method. The method includes activating, by the controller 120, a first dry-clean operation (e.g., a first instance of the dry-clean operation 136) using a first dry-clean recipe that includes one or more cleaning parameters to clean the injector nozzle 128 of the deposition tool 102. The method includes receiving, by the controller 120 from a first sensor (e.g., the gas concentration sensor 144), first data that corresponds to a concentration of a first chemical compound (e.g., a first type of the chemical compound 138, such as $SiF_4$) in a first cleaning gas (e.g., a first type of the cleaning gas 124, such as $F_2$) associated with the first dry-clean operation. The method includes receiving, by the controller 120 from a second sensor (e.g., the temperature sensor 142), second data that corresponds to a temperature of an exothermic reaction associated with the first dry-clean operation. The method includes determining, by the controller 120 based on the first data and the second data, that the first dry-clean operation is complete. The method includes deactivating, by the controller 120, the first dry-clean operation.

Additionally, or alternatively, the method includes activating, by the controller 120, a second dry-clean operation (e.g., a second instance of the dry-clean operation 136) using a second dry-clean recipe that includes one or more cleaning parameters to clean a deposition chamber (e.g., the deposition chamber 116) of the deposition tool 102. The method includes receiving, by the controller 120 from the first sensor, third data that corresponds to a concentration of a second chemical compound (e.g., a second type of the chemical compound 138, which may be the same as the first chemical compound) within the second cleaning gas (e.g., a second type of the cleaning gas 124, which may be the same as the first cleaning gas) associated with the second dry-clean operation. The method includes receiving, by the controller 120 from the second sensor, fourth data that corresponds to a temperature of an exothermic reaction associated with the second dry-clean operation. The method includes determining, by the controller 120 based on the third data and the fourth data, that the second dry-clean operation is complete. The method includes deactivating, by the controller 120, the second dry-clean operation.

FIG. 1C shows an example implementation of the foreline 134, the temperature sensor 142, and the gas concentration sensor 144. As shown, the temperature sensor 142 is mounted to a first portion of the foreline 134. The first portion may be near an outlet of a chamber (e.g., near the gas outlet 132 of the deposition chamber 116).

The gas concentration sensor 144 is mounted to a second portion of the foreline 134. As a concentration of a chemical compound in a cleaning gas (e.g., the concentration of the chemical compound 138 in the cleaning gas 124) may not be susceptible to changes based on a location of the gas concentration sensor 144, the second portion may be located "downstream" from the first portion.

In some implementations, a heating component 150 is mounted to the foreline 134 proximate to the gas concentration sensor 144. The heating component 150 (which may be communicatively coupled to the controller 120) may be configured to maintain a temperature of the second portion of the foreline in a range of approximately 150 degrees Celsius to approximately 180 degrees Celsius. If the temperature of the second portion of the foreline is less than approximately 150 degrees Celsius, a buildup of material near or proximate to the gas concentration sensor 144 may occur to cause a measurement inaccuracy by the gas concentration sensor 144. If the temperature of the second portion of the foreline is greater than approximately 180 degrees, damage to the foreline 134 and/or the gas concentration sensor 144 may occur. However, other values and ranges for the temperature of the second portion of the foreline 134, as maintained by the heating component 150, are within the scope of the present disclosure.

In some implementations, the temperature sensor 142 and/or the gas concentration sensor 144 are mounted to other locations of the deposition tool 102. For example, the temperature sensor 142 and the gas concentration sensor 144 may be mounted on a wall of deposition chamber 116 for a case in which the deposition tool 102 includes a CVD or PVD tool. In a case where the chamber 116 corresponds to a furnace component operating at a high temperature (e.g., above approximately 500 degrees Celsius), the temperature sensor 142 and the gas concentration sensor 144 may be mounted downstream of the chamber 116 at a location where the temperature is lower (e.g., below approximately 180 degrees Celsius). Additionally, or alternatively, locations of the temperature sensor 142 and the gas concentration sensor 144 may correspond to different locations within the deposition tool 102 (e.g., the temperature sensor 142 may be mounted within the deposition chamber 116, and the gas concentration sensor 144 may be mounted to the foreline 134, among other examples).

In some implementations, different types of the cleaning gas 124 may be used for the first dry-clean and the second dry-clean operation. Additionally, or alternatively, different recipes may be used for the first dry-clean and the second dry-clean operation. Additionally, or alternatively, different types of the chemical compound 138 may be present as part of the first dry-clean operation versus the second dry-clean operation.

The number and arrangement of devices shown in FIGS. 1A-1C are provided as one or more examples. In practice, there may be additional devices, fewer devices, different devices, or differently arranged devices than those shown in FIGS. 1A-1C. Furthermore, two or more devices shown in FIGS. 1A-1C may be implemented within a single device, or a single device shown in FIGS. 1A-1C may be implemented as multiple, distributed devices. Additionally, or alternatively, a set of devices (e.g., one or more devices) of the deposition tool 102 may perform one or more functions described as being performed by another set of devices of the deposition tool 102.

Figure 2:
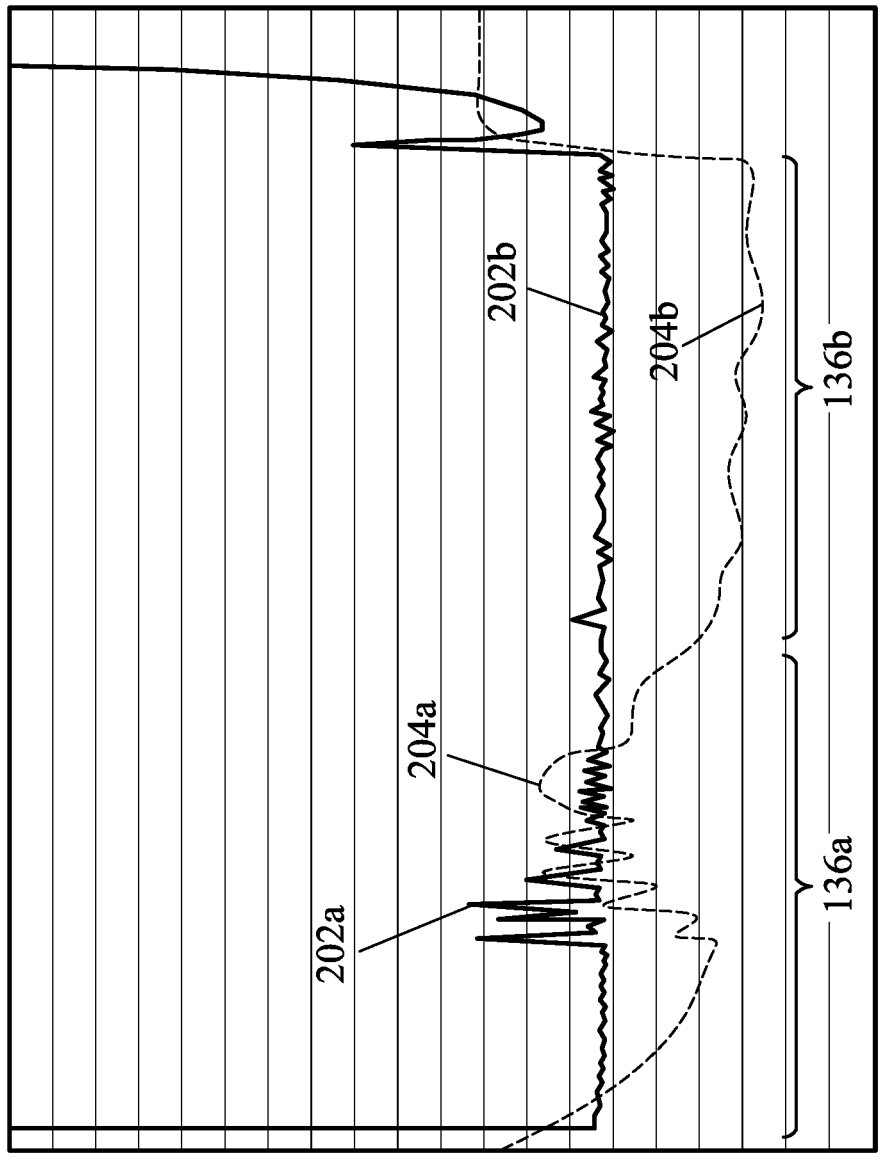
FIG. 2 is a diagram of an example implementation described herein.

FIG. 2 is a diagram of an example implementation 200 described herein. FIG. 2 includes example data that may be recorded by the temperature sensor 142 and/or the gas concentration sensor 144 using variations of the dry-clean operation 136 (e.g., different dry-clean recipes) for different portions of the deposition tool 102 (e.g., the deposition chamber 116 and the injector nozzle 128).

FIG. 2 shows data relating to the example dry-clean operation 136 in the deposition tool 102. As shown, a first dry-clean operation 136a may use a first dry-clean recipe to clean the deposition chamber 116. As an example, the first dry-clean recipe may include the cleaning gas 124 (e.g., $F_2$, among other examples) that is pressurized to approximately 6 kilopascals. The first dry-clean recipe may further include a first combination of a temperature and/or a flow rate for the cleaning gas 124 that is tailored to remove (e.g., etch) a deposit and/or residual thin-film material (e.g., SiCN or SiCON, among other examples) from the interior surface of the deposition chamber 116. During the first dry-clean operation 136a, the gas concentration sensor 144 may provide, to the controller 120, first data 202a corresponding to a concentration of the chemical compound 138 formed in the cleaning gas 124 during the first dry-clean operation 136a. Peaks and/or high points in the concentration as represented by the first data 202a may indicate, at least in part, that the first dry-clean operation 136a is active and/or incomplete. Conversely, a reduction or stabilization in the concentration as represented by the first data 202a may indicate, at least in part, that the first dry-clean operation 136a is inactive and/or complete.

Additionally, or alternatively, the temperature sensor 142 may provide, to the controller 120, second data 204a corresponding to a temperature of the cleaning gas 124 during the first dry-clean operation 136a. Peaks and/or high points of the temperature as represented by the second data 204a may be generated by an exothermic reaction and indicate, at least in part, that the first dry-clean operation 136a is active and/or incomplete. Conversely, a reduction or stabilization of the temperature as represented by the second data 204a may indicate, at least in part, that the exothermic reaction no longer exists and that the first dry-clean operation 136a is inactive and/or complete.

Based on the first data and the second data, the controller 120 may determine that the first dry-clean operation 136a is complete. In response to determining that the first dry-clean operation 136a is complete, the controller 120 may deactivate the first dry-clean operation 136a and activate a second dry-clean operation 136b.

The second dry-clean operation 136b may use a second dry-clean recipe to clean the injector nozzle 128. As an example, the second dry-clean recipe may include the cleaning gas 124 (e.g., $F_2$, among other examples) that is also pressurized to approximately 6 kilopascals. The second dry-clean recipe may further include a second combination of a temperature and/or a flow rate for the cleaning gas 124 that is tailored to remove (e.g., etch) a deposit and/or residual thin-film material (e.g., SiCN or SiCON, among other examples) from the injector nozzle 128. During the second dry-clean operation 136b, the gas concentration sensor 144 may provide, to the controller 120, third data 202b corresponding to a concentration of the cleaning compound 138 formed in the cleaning gas 124 during the second dry-clean operation 136b.

Additionally, or alternatively, the temperature sensor 142 may provide, to the controller 120, fourth data 204b corresponding to a temperature of the cleaning gas 124 during the second dry-clean operation 136b.

Based on the third data and the fourth data, the controller 120 may determine that the second dry-clean operation 136b is complete. In response to determining that the second dry-clean operation 136b is complete, the controller 120 may deactivate the second dry-clean operation 136b and provide, to the notification system 146, instructions to cause the notification system 146 to indicate that both the first dry-clean operation 136a and the second dry-clean operation 136b are complete.

The controller 120 may, through use of the first data 202a, the second data 204a, the third data 202b, or the fourth data 204b, provide advantages and benefits over other dry-clean techniques. For example, and in contrast to a dry-clean operation relying on quartz test pieces, the first dry-clean operation 136a and the second dry-clean operation 136b may be nearly continuous, either individually or sequentially, without a need for interruption to either obtain read points from quartz test pieces or to exchange quartz test pieces, and as such may be more efficient. Additionally, or alternatively, the first dry-clean operation 136a and the second dry-clean operation 136b may, through machine learning techniques, yield more thorough cleaning results in comparison to the use of quartz test pieces, and as such be more effective. Additionally, or alternatively, the first dry-clean operation 136a and/or the second dry-clean operation 136b may consume less cleaning gas (e.g., less F2) and avoid over-cleaning (e.g., over-etching) to reduce damage to the interior surface of the deposition chamber 116.

As indicated above, FIG. 2 is provided as an example. Other examples may differ from what is described with regard to FIG. 2.

Figure 3A:
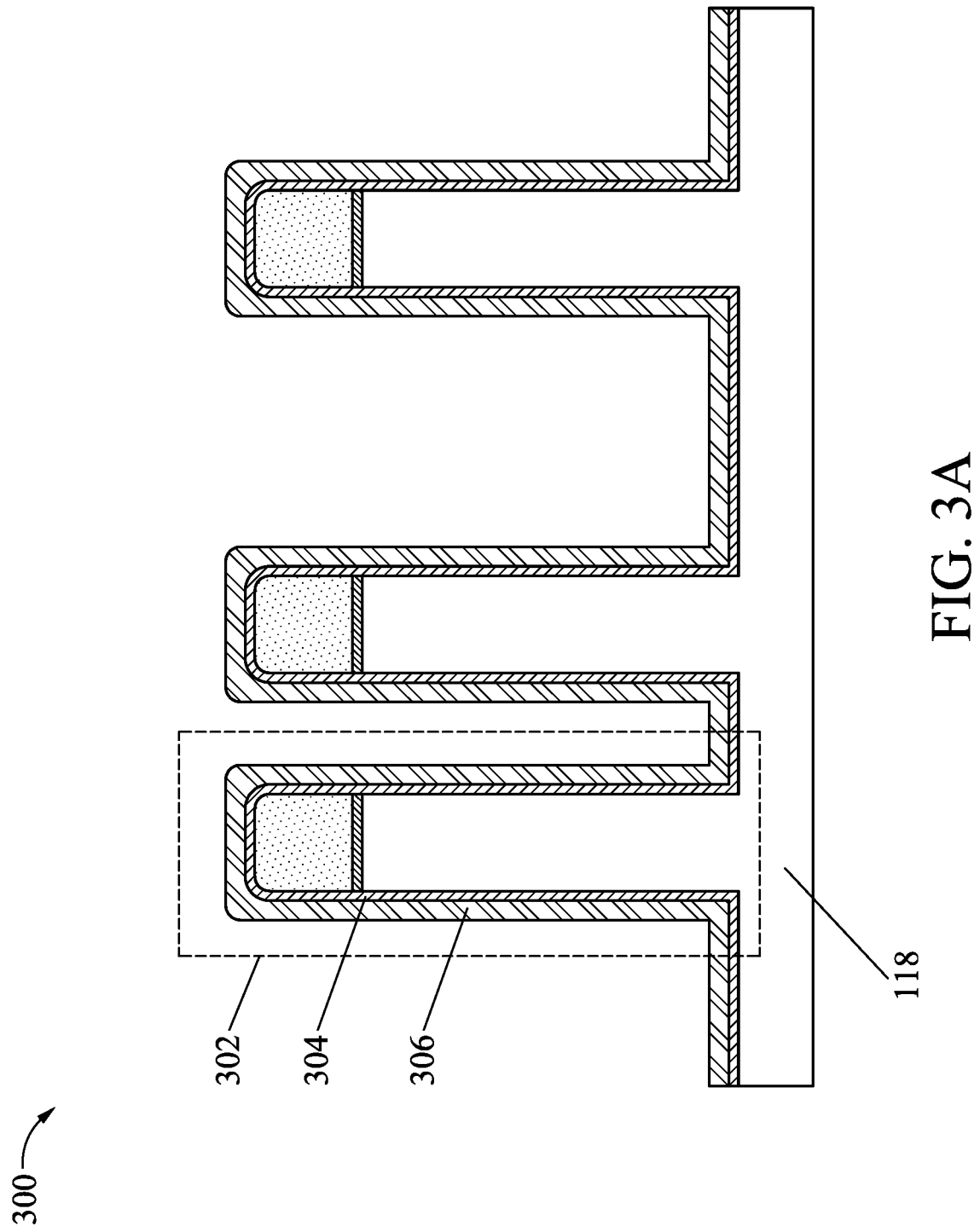
FIGS. 3A and 3B are diagrams of an example implementation of a deposition operation performed by a deposition tool described herein.
Figure 3B:
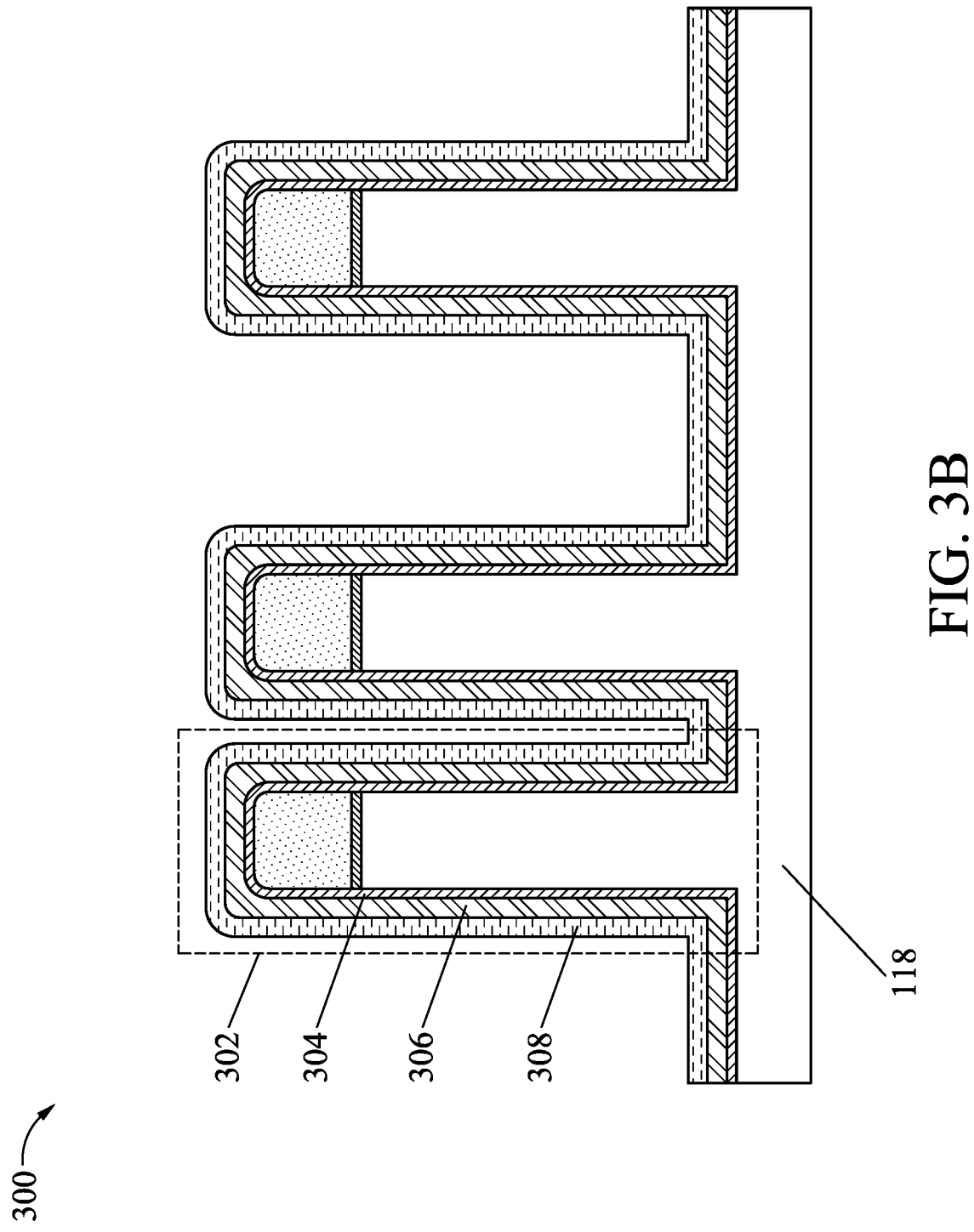

FIGS. 3A and 3B are diagrams of an example implementation 300 of a deposition operation performed by the deposition tool 102 described herein. The deposition tool 102 may perform the deposition operation as part of manufacturing semiconductor product on the semiconductor substrate 118 of FIG. 1B.

As shown in FIG. 3A, a combination of operations performed by the semiconductor processing tools 102-112 has formed a fin structure 302 (e.g., a finFET structure) over the semiconductor substrate 118. As an example, and as shown, the fin structure 302 includes a layer 304 of an Si material and a layer 306 of an $SiO_2$ material.

Turning to FIG. 3B, the deposition tool 102 may form, over the layer 306, a layer 308 of, for example, an SiOCN material. The cleaning-control subsystem 140, which may have performed the dry-clean operation 136, described above, during preventive maintenance of the deposition tool 102, may reduce the likelihood of particulates (e.g., particulates from deposits or residual thin film materials within the deposition chamber 116 and/or the injector nozzle 128) forming in the layer 308 during deposition. Such a reduction may improve a yield of the semiconductor product formed on the semiconductor substrate 118. Furthermore, the dry-clean operation 136 performed using the cleaning-control subsystem 140 may reduce a downtime of the deposition tool 102 during the preventive maintenance, and improve a throughput of the semiconductor product formed using the deposition tool 102.

As indicated above, FIGS. 3A and 3B are provided as examples. Other examples may differ from what is described with regard to FIGS. 3A and 3B.

Figure 4A:
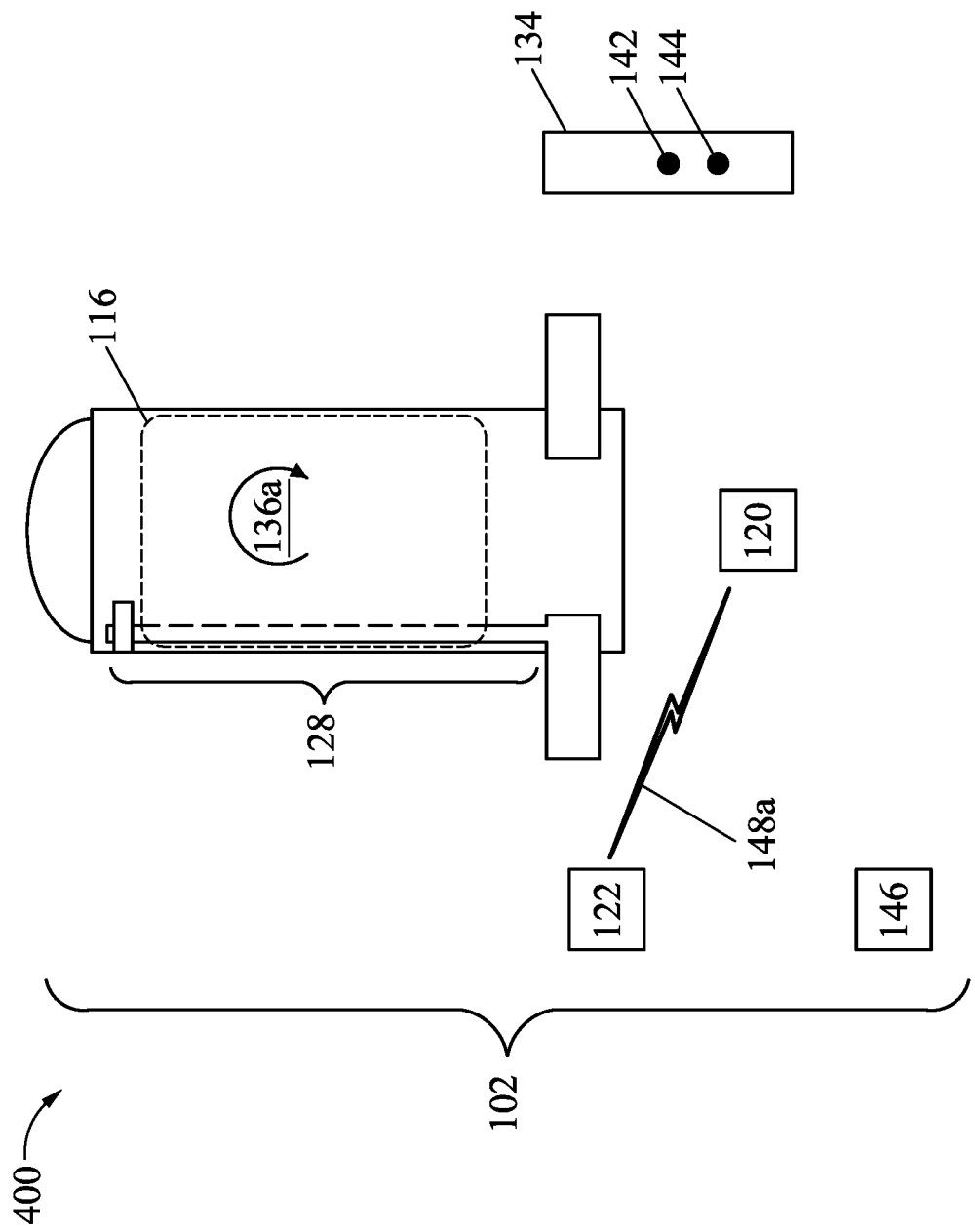
FIGS. 4A-4F are diagrams of an example implementation of a dry-clean operation performed by a cleaning-control subsystem described herein.

FIGS. 4A-4F are diagrams of an example implementation 400 of the dry-clean operation 136 performed by the cleaning-control subsystem 140 described herein. FIG. 4A shows the controller 120 activating the first dry-clean operation 136a using a first dry-clean recipe. The controller 120 may activate the first dry-clean operation 136a by transmitting a message (e.g., an activation command message) to the gas source 122 using one or more communication links 148a. In some implementations, the message may include one or more cleaning parameters corresponding to the first dry-clean recipe. Furthermore, the first dry-clean recipe may be tailored to clean the injector nozzle 128.

Figure 4B:
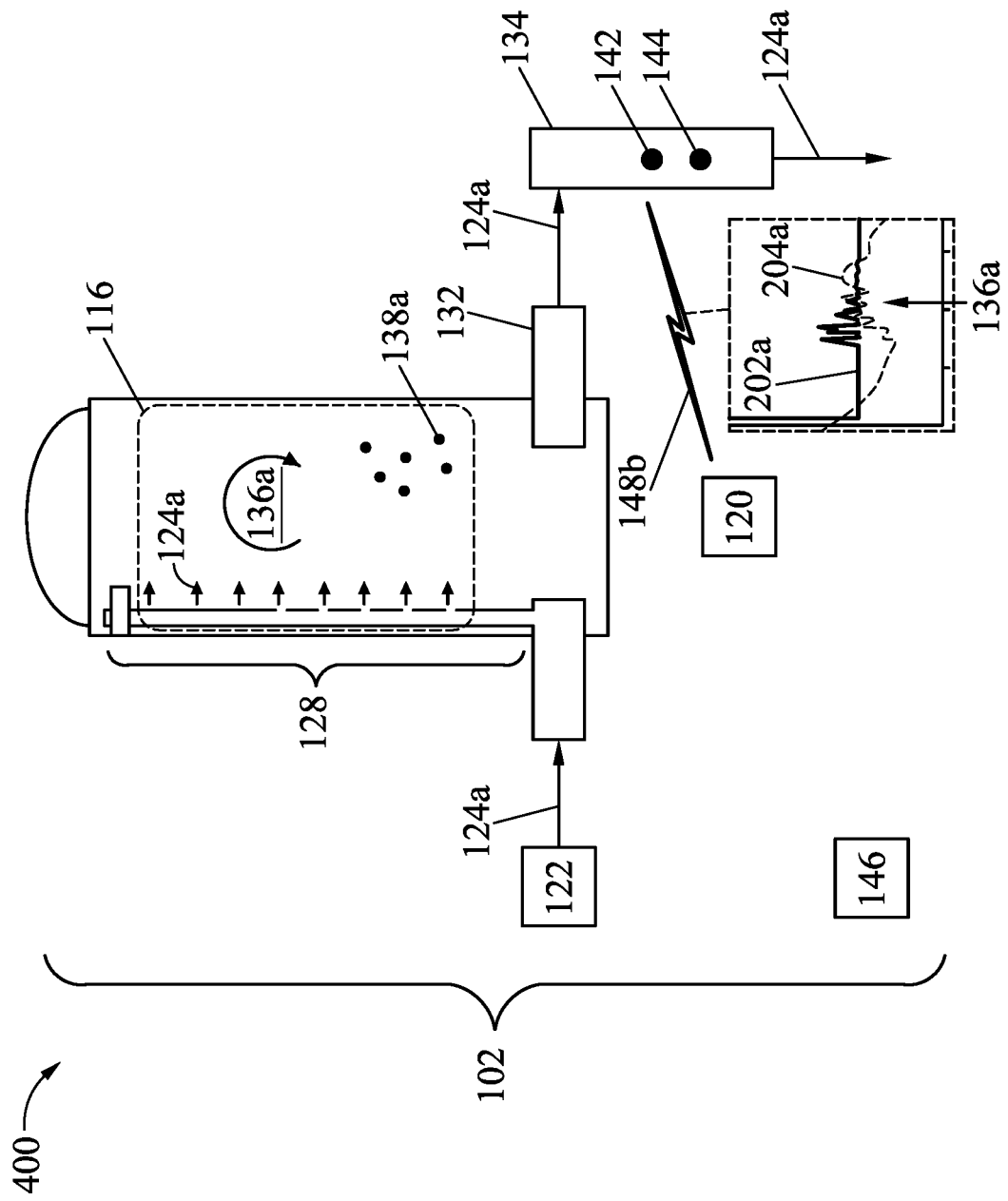

FIG. 4B shows the first cleaning gas 124a (e.g., the $F_2$ gas or another cleaning gas) flowing through the injector nozzle 128. The first chemical compound 138a (e.g., the $SiF_4$ or another chemical compound) is generated as part of the first dry-clean operation 136a. The first cleaning gas 124a flows through the gas outlet 132 and into the foreline 134. Also, as shown in FIG. 4B, the temperature sensor 142 transmits the first data 202a (e.g., corresponding to a temperature of the first cleaning gas 124a) to the controller 120, and the gas concentration sensor 144 transmits the second data 204a (e.g., corresponding to a concentration of the first chemical compound 138a in the first cleaning gas 124a) to the controller 120 using one or more of the communication links 148b.

Figure 4C:
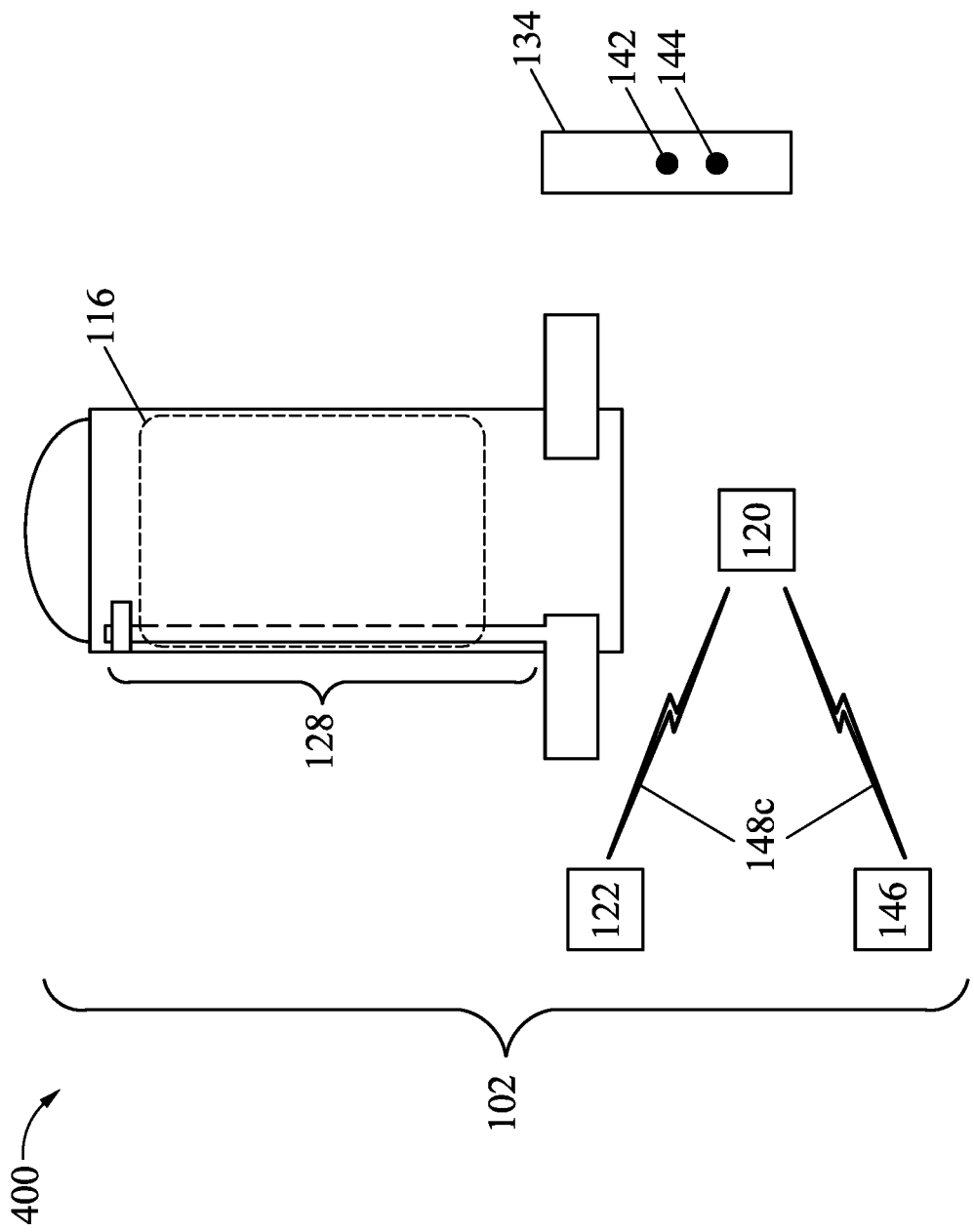

Turning to FIG. 4C, the controller 120 determines, based on the first data 202a and the second data 204b, that the first dry-clean operation 136a is complete. In some implementations, the controller 120 uses a machine learning algorithm to make the determination. The controller 120 deactivates the first dry-clean operation 136a by transmitting a message (e.g., a deactivation command message) to the gas source 122 using one or more of the communication links 148c. In some implementations, and as shown, the controller 120 transmits a message (e.g., a notification command message) to the notification system 146 using one or more of the communication links 148c to cause the notification system 146 to indicate that the first dry-clean operation 136a is complete.

Figure 4D:
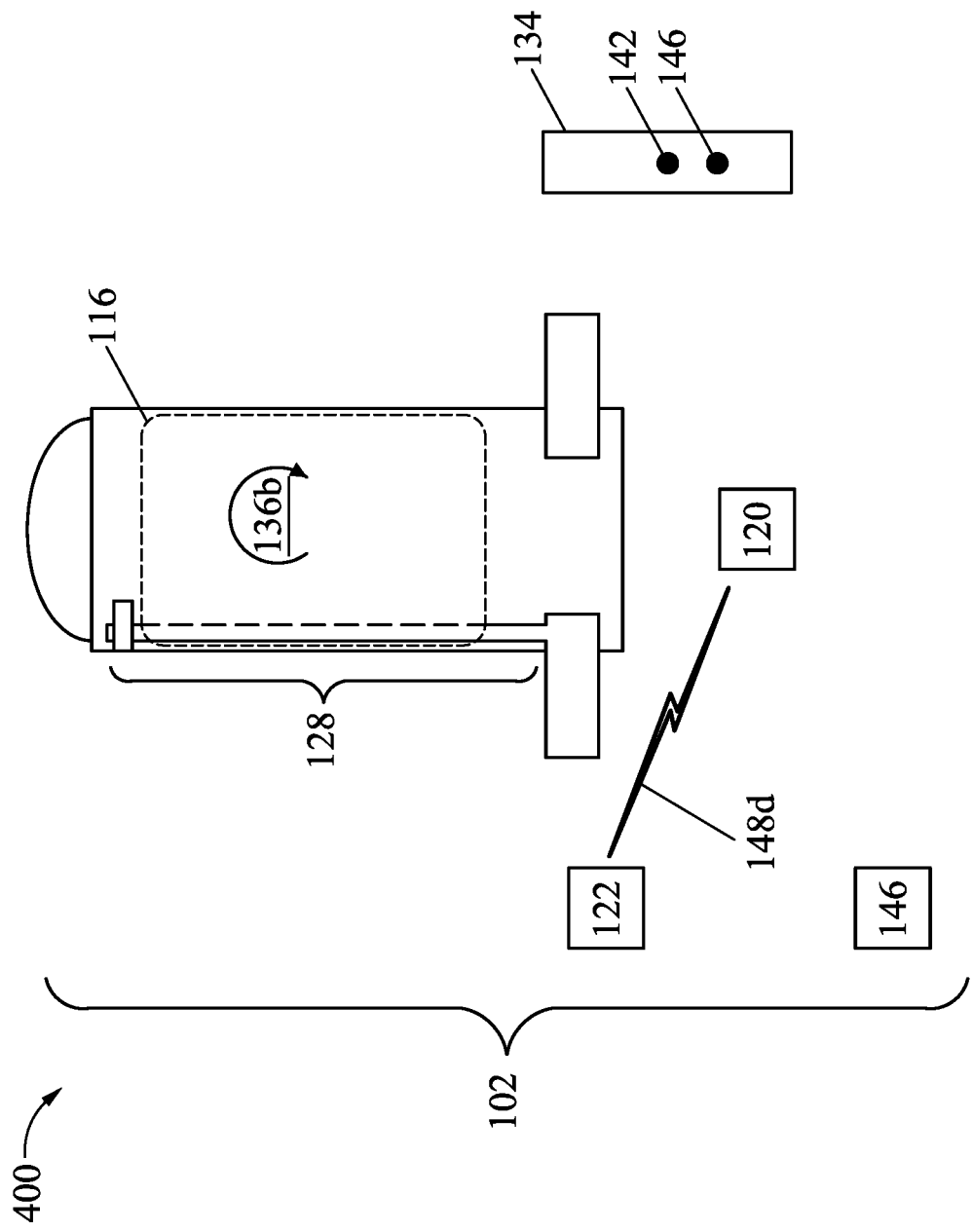

FIG. 4D shows the controller 120 activating the second dry-clean operation 136b using a second dry-clean recipe. The controller 120 may activate the second dry-clean operation 136b by transmitting a message (e.g., an activation command message) to the gas source 122 using one or more of the communication links 148d. In some implementations, the message may include one or more cleaning parameters corresponding to the second dry-clean recipe. Furthermore, the second dry-clean recipe may be tailored to clean the deposition chamber 116.

Figure 4E:
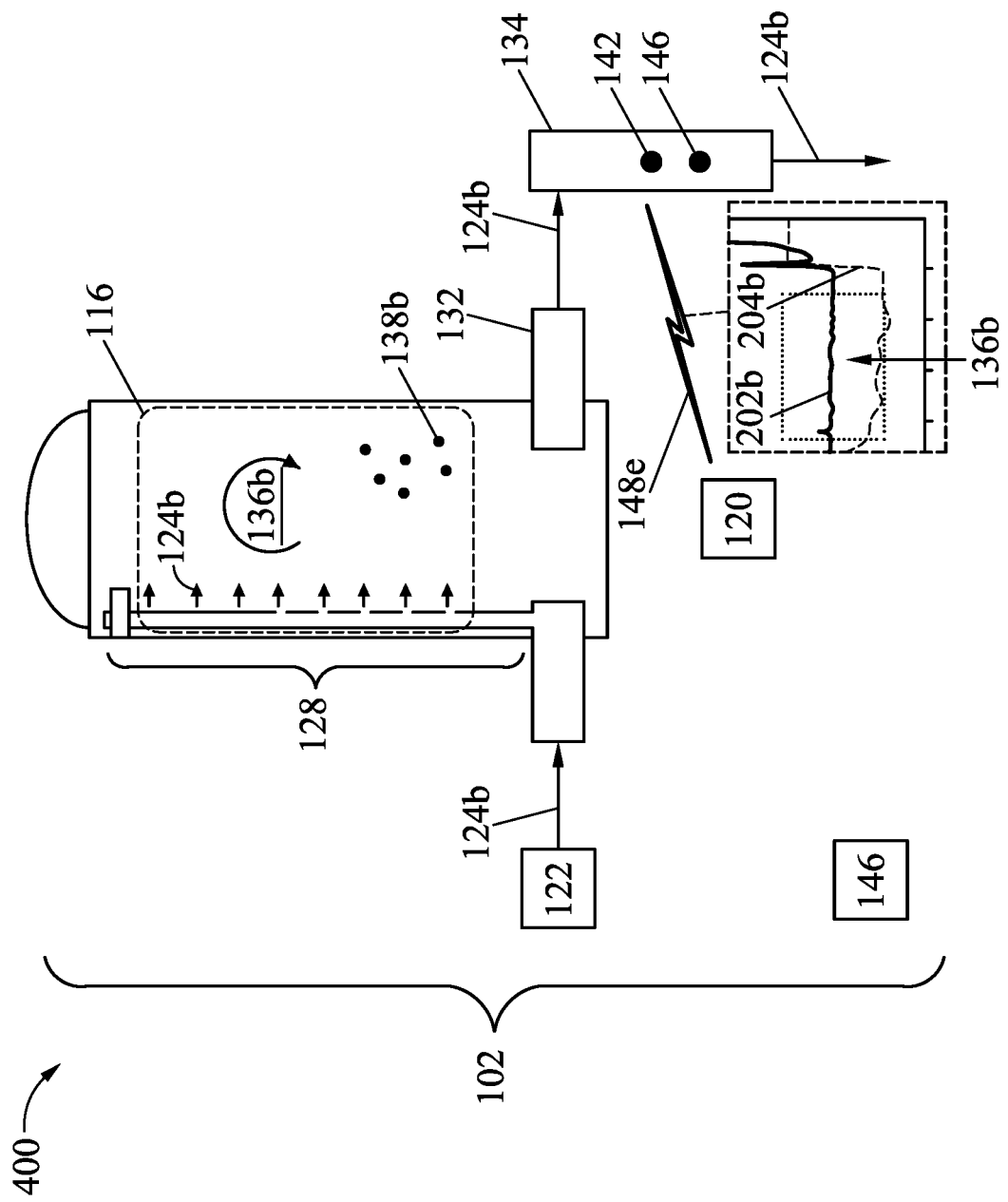

FIG. 4E shows the second cleaning gas 124b (e.g., the $F_2$ gas or another cleaning gas) flowing through the injector nozzle 128. The second chemical compound 138b (e.g., the $SiF_4$ or another chemical compound) is generated as part of the second dry-clean operation 136b. The second cleaning gas 124b flows through the gas outlet 132 and into the foreline 134. Also, as shown in FIG. 4E, the temperature sensor 142 transmits the third data 202b (e.g., corresponding to a temperature of the second cleaning gas 124b) to the controller 120, and the gas concentration sensor 144 transmits the fourth data 204b (e.g., corresponding to a concentration of the second chemical compound 138b in the second cleaning gas 124b) to the controller 120 using one or more of the communication links 148e.

Figure 4F:
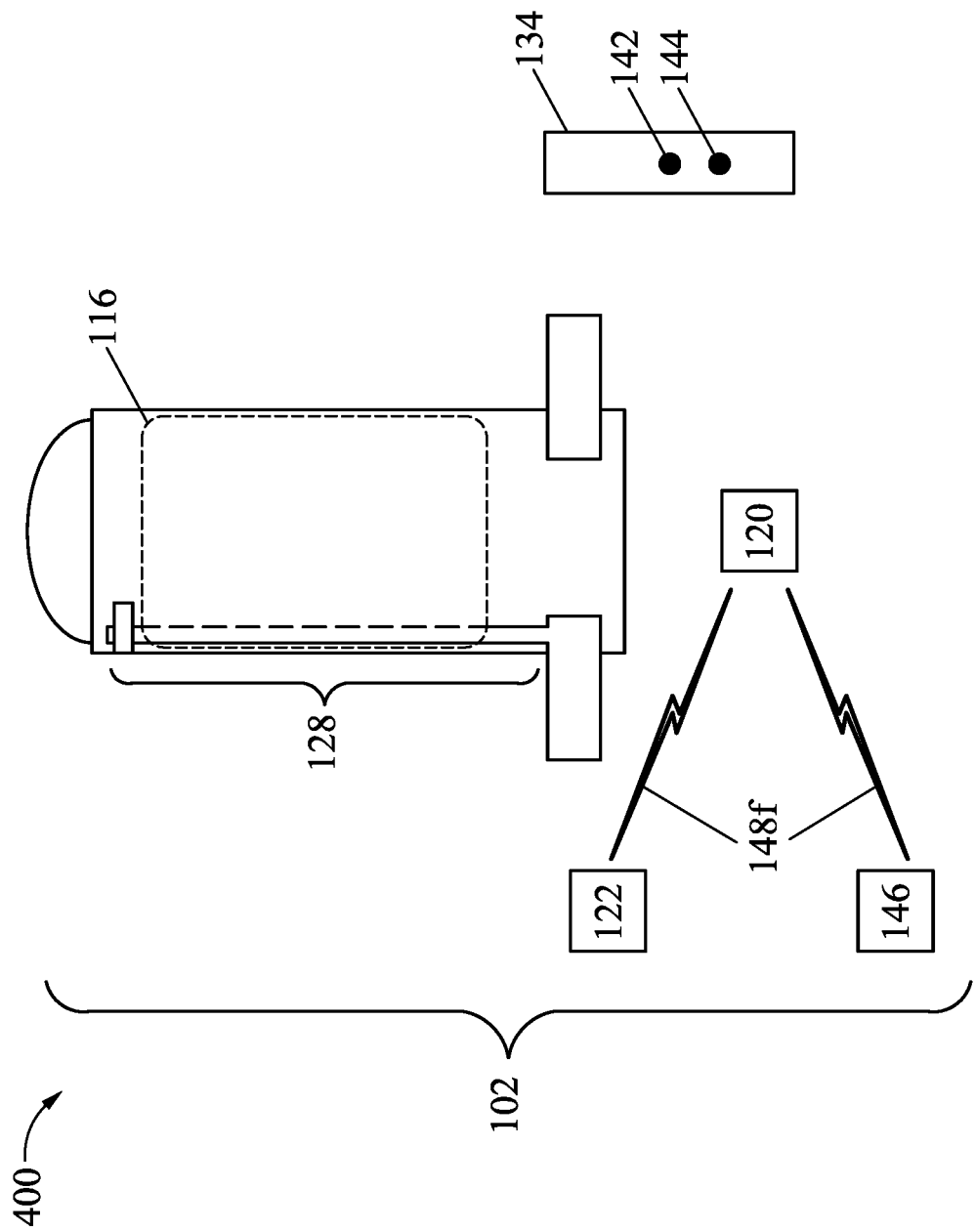

Turning to FIG. 4F, the controller 120 determines, based on the third data 202b and the fourth data 204b, that the second dry-clean operation 136b is complete. In some implementations, the controller 120 uses a machine learning algorithm to make the determination. The controller 120 deactivates the second dry-clean operation 136b by transmitting a message (e.g., a deactivation command message) to the gas source 122 using one or more of the communication links 148f. In some implementations, and as shown, the controller 120 transmits a message (e.g., a notification command message) to the notification system 146 using one or more of the communication links 148f to cause the notification system 146 to indicate that the second dry-clean operation 136b is complete.

In some implementations, the first cleaning gas 124a and the second cleaning gas 124b are a same type of cleaning gas (e.g., $F_2$). In some implementations, the first chemical compound 138a and the second chemical compound 138b are a same type of chemical compound. (e.g., $SiF_4$). However, different types of cleaning gases and chemical compounds are within the scope of the present disclosure. Furthermore, different combinations of types of the first cleaning gas 124a, the second cleaning gas 124b, the first chemical compound 138a, and the second chemical compound 138b are within the scope of the present disclosure.

As indicated above, FIGS. 4A-4F are provided as examples. Furthermore, in some implementations, the dry-clean operations 136a and/or 136b may include fewer operations, or differently arranged operations than those depicted and described by FIGS. 4A-4F.

Figure 5:
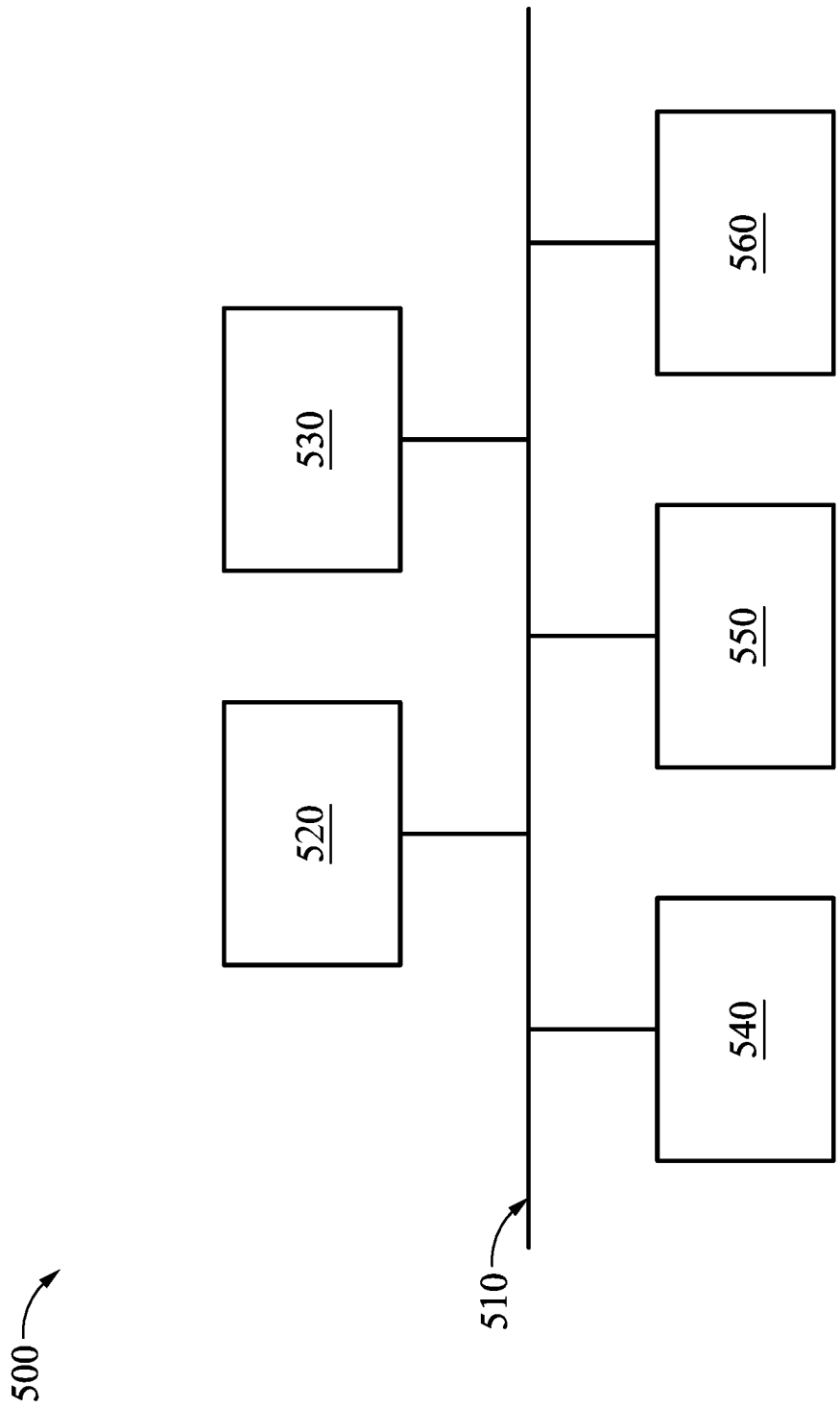
FIG. 5 is a diagram of example components of one or more devices of FIG. 1 described herein.

FIG. 5 is a diagram of example components of a device 500, which may correspond to the deposition tool 102, the controller 120, the gas concentration sensor 144, the temperature sensor 142, or the cleaning-control subsystem 140. In some implementations, the deposition tool 102, the controller 120, the gas concentration sensor 144, the temperature sensor 142, or the cleaning-control subsystem 140 include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
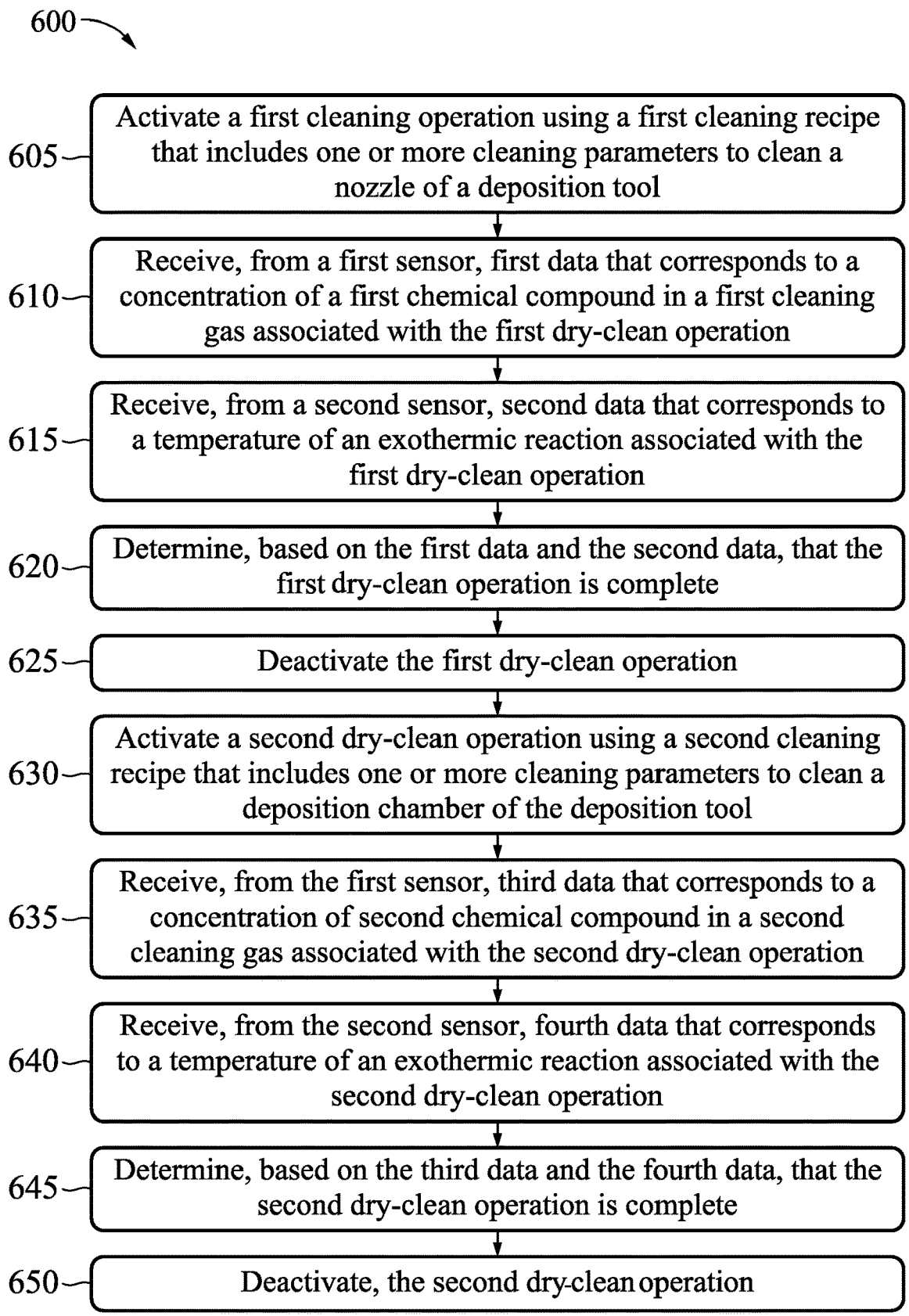
FIG. 6 is a flowchart of an example process associated with a cleaning-control subsystem described herein.

FIG. 6 is a flowchart of an example process 600 associated with a cleaning-control subsystem described herein. In some implementations, one or more process blocks of FIG.

6 are performed by a controller (e.g., controller 120). In some implementations, one or more process blocks of FIG. 6 are performed by another device or a group of devices separate from or including the controller 120, such as the deposition tool 102, the gas concentration sensor 144, the temperature sensor 142, or the cleaning-control subsystem 140. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include activating a first dry-clean operation using a first dry-clean recipe that includes one or more cleaning parameters to clean an injector nozzle of a deposition tool (block 605). For example, the controller 120 may activate a first dry-clean operation 136a using a first dry-clean recipe that includes one or more cleaning parameters to clean an injector nozzle 128 of a deposition tool 102, as described above.

As further shown in FIG. 6, process 600 may include receiving first data that corresponds to a concentration of a chemical compound in a cleaning gas associated with the first dry-clean operation (block 610). For example, the controller 120 may receive first data 202a that corresponds to a concentration of a first chemical compound (e.g., a concentration of the chemical compound 138) in a first cleaning gas (e.g., the cleaning gas 124) associated with the first dry-clean operation 136a, as described above.

As further shown in FIG. 6, process 600 may include receiving second data that corresponds to a temperature of an exothermic reaction associated with the first dry-clean operation (block 615). For example, the controller 120 may receive second data 204a that corresponds to a temperature of an exothermic reaction associated with the first dry-clean operation 136a, as described above.

As further shown in FIG. 6, process 600 may include determining, based on first data and the second data, that the first dry-clean operation is complete (block 620). For example, the controller may determine, based on the first data 202a the second data 204a, that the first dry-clean operation 136a is complete, as described above.

As further shown in FIG. 6, process 600 may include deactivating the first dry-clean operation (block 625). For example, the controller 120 may deactivate the first dry-clean operation 136a, as described above.

As further shown in FIG. 6, process 600 may include activating a second dry-clean operation using a second dry-clean recipe that includes one or more cleaning parameters to clean a deposition chamber of the deposition tool (block 630). For example, the controller 120 may activate a second dry-clean operation 136b using a second dry-clean recipe that includes one or more cleaning parameters to clean a deposition chamber 116 of the deposition tool 102, as described above.

As further shown in FIG. 6, process 600 may include receiving third data that corresponds to a concentration of a second cleaning gas associated with the second dry-clean operation (block 635). For example, the controller 120 may receive third data 202b that corresponds to a concentration of a second chemical compound (e.g., a concentration of the chemical compound 138) of a second cleaning gas (e.g., the cleaning gas 124) associated with the second dry-clean operation 136b, as described above.

As further shown in FIG. 6, process 600 may include receiving fourth data that corresponds to a temperature of an exothermic reaction associated with the second dry-clean operation (block 640). For example, the controller 120 may receive fourth data 204b that corresponds to a temperature of an exothermic reaction associated with the second dry-clean operation 136b, as described above.

As further shown in FIG. 6, process 600 may include determining, based on the third data and the fourth data, that the second dry-clean operation is complete (block 645). For example, the controller 120 may determine, based on the third data 202b the fourth data 204b, that the second dry-clean operation 136b is complete, as described above.

As further shown in FIG. 6, process 600 may include deactivating the second dry-clean operation (block 650). For example, the controller 120 may deactivate the second dry-clean operation 136b, as described above.

Process 600 may include additional implementations, such as any single implementation or any combination of implementations described below and/or in connection with one or more other processes described elsewhere herein.

In a first implementation, determining that the first dry-clean operation 136a is complete includes identifying a reduction in the concentration of the first chemical compound 138a in the first cleaning gas 124a, a stabilization in the concentration of the first chemical compound 138a in the first cleaning gas 124a, a reduction in the temperature of the first cleaning gas 124a, or a stabilization in the temperature of the first cleaning gas 124ja.

In a second implementation, alone or in combination with the first implementation, determining that the second dry-clean operation 136b is complete includes identifying a reduction in the concentration of the second chemical compound 138b in the second cleaning gas 124b, a stabilization in the concentration of the second chemical compound 138b in the second cleaning gas 124b, a reduction in the temperature of the second cleaning gas 124b, or a stabilization in the temperature of the second cleaning gas 124b.

In a third implementation, alone or in combination with one or more of the first and second implementations, deactivating the first dry-clean operation 136a and activating the second dry-clean operation 136b is in response to determining that the first dry-clean operation 136a is complete.

In a fourth implementation, alone or in combination with one or more of the first through third implementations, one or more cleaning parameters correspond to a respective combination of a pressure, a flow rate, or a temperature for the first cleaning gas 124a and/or the second cleaning gas 124b.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Some implementations described herein provide techniques and apparatuses for determining a performance of a dry-clean operation within a deposition tool. A cleaning-control subsystem of the deposition tool may include a gas concentration sensor and a temperature sensor mounted in an exhaust system of the deposition tool to monitor the dry-clean operation. The gas concentration sensor may provide data related to a concentration of a chemical compound in a cleaning gas, where the chemical compound is a bi-product of the dry-clean operation. The temperature sensor may provide temperature data related to an exothermic reaction of the dry-clean operation. Such data may be used to determine an efficiency and/or an effectiveness of the dry-clean operation within the deposition tool.

In this way, an accuracy of a performance of the dry-clean operation within the deposition tool is increased, resulting in an improved yield of semiconductor product fabricated using the deposition tool. Additional benefits include a decrease in a consumption of cleaning gases to save costs, and a decrease in a downtime related to cleaning the deposition tool to increase a throughput of semiconductor product fabricated using the deposition tool.

As described in greater detail above, some implementations described herein provide a cleaning-control subsystem. The cleaning-control subsystem includes a gas concentration sensor. The cleaning-control subsystem includes a temperature sensor. The cleaning-control subsystem includes a controller configured, receive, from the gas concentration sensor, data corresponding to a concentration of a chemical compound formed in a cleaning gas during a dry-clean operation for a deposition tool, receive, from the temperature sensor, data corresponding to a temperature of the cleaning gas, and determine, based on the data corresponding to the concentration of the chemical compound formed in the cleaning gas and the data corresponding to the temperature of the cleaning gas, that the dry-clean operation is complete. The controller is configured to transmit, based on determining that the dry-clean operation is complete, instructions to a notification system to cause the notification system to indicate that the dry-clean operation is complete.

As described in greater detail above, some implementations described herein provide a thin-film furnace. The thin-film furnace includes a deposition chamber. The thin-film furnace includes a foreline connected to a gas outlet of the deposition chamber. The thin-film furnace includes a non-dispersive infrared sensor mounted to the foreline. The thin-film furnace includes a thermocouple mounted to the foreline. The thin-film furnace includes a controller configured to activate a dry-clean operation, where the dry-clean operation forms a concentration of a chemical compound in a cleaning gas, and where the cleaning gas passes from the deposition chamber through the foreline. The controller is configured to receive, from the non-dispersive infrared sensor, data corresponding to the concentration of the chemical compound in the cleaning gas, receive, from the thermocouple, data corresponding to a temperature of the cleaning gas, and determine, based on the data corresponding to the concentration of the chemical compound in the cleaning gas and the data corresponding to the temperature of the cleaning gas, that the dry-clean operation is complete. The controller is configured to deactivate, based on determining that the dry-clean operation is complete, the dry-clean operation.

As described in greater detail above, some implementations described herein provide a method. The method includes activating, by a controller, a first dry-clean operation using a first dry-clean recipe that includes one or more cleaning parameters to clean an injector nozzle of a deposition tool. The method includes receiving, by the controller from a first sensor, first data that corresponds to a concentration of a first chemical compound in a first cleaning gas associated with the first dry-clean operation. The method includes receiving, by the controller from a second sensor, second data that corresponds to a temperature of an exothermic reaction associated with the first dry-clean operation. The method includes determining, by the controller based on the first data and the second data, that the first dry-clean operation is complete. The method includes deactivating, by the controller, the first dry-clean operation. The method includes activating, by the controller, a second dry-clean operation using a second dry-clean recipe that includes one or more cleaning parameters to clean a deposition chamber of the deposition tool. The method includes receiving, by the controller from the first sensor, third data that corresponds to a concentration of a second chemical compound in a second cleaning gas associated with the second dry-clean operation. The method includes receiving, by the controller from the second sensor, fourth data that corresponds to a temperature of an exothermic reaction associated with the second dry-clean operation. The method includes determining, by the controller based on the third data and the fourth data, that the second dry-clean operation is complete. The method includes deactivating, by the controller, the second dry-clean operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning-control subsystem, comprising:
   a gas concentration sensor;
   a temperature sensor; and
   a controller configured to:
      receive, from the gas concentration sensor, initial first data indicating a first concentration of a chemical compound formed in a cleaning gas during a first dry-clean operation for a deposition tool,
      receive, from the temperature sensor, initial second data indicating a first temperature of the cleaning gas,
      determine, based on initial first data and the initial second data and using a machine learning model, a particular combination of a second concentration of the chemical compound formed in the cleaning gas and a second temperature of the cleaning gas indicates a level of cleanliness of the deposition tool,
      determine, based on determining the particular combination of the second concentration of the chemical compound formed in the cleaning gas and the second temperature of the cleaning gas indicates the level of cleanliness of the deposition tool, the first dry-clean operation is complete,
      receive, during a second dry-clean operation for the deposition tool, subsequent first data, from the gas concentration sensor and indicating the second concentration of the chemical compound, and subsequent second data, from the temperature sensor and indicating the second temperature of the cleaning gas,
      determine, based on the subsequent first data and the subsequent second data, that the level of cleanliness of the deposition tool has been reached,
      determine, based on determining that the level of cleanliness of the deposition tool has been reached, that the second dry-clean operation is complete, and
      deactivate, based on determining that the second dry-clean operation is complete, the second dry-clean operation.

2. The cleaning-control subsystem of claim 1, wherein the machine learning model correlates one or more historical operating conditions to the level of cleanliness of the deposition tool.

3. The cleaning-control subsystem of claim 2, wherein the one or more historical operating conditions corresponds to a dry-clean recipe.

4. The cleaning-control subsystem of claim 3, wherein the dry-clean recipe indicates one or more of:
   a pressure of the cleaning gas,
   a temperature of the cleaning gas, or
   a flow rate of the cleaning gas.

5. The cleaning-control subsystem of claim 1, wherein the level of cleanliness corresponds to an amount of a buildup of a thin-film material in or on an injector nozzle within the deposition tool.

6. The cleaning-control subsystem of claim 1, wherein the level of cleanliness corresponds to an amount of a buildup of a thin-film material on an interior surface of a chamber within the deposition tool.

7. The cleaning-control subsystem of claim 1, wherein the gas concentration sensor is mounted to a wall of a chamber of the deposition tool.

8. The cleaning-control subsystem of claim 1, wherein the gas concentration sensor corresponds to a non-dispersive infrared sensor mounted to a portion of the deposition tool through which the cleaning gas flows.

9. The cleaning-control subsystem of claim 8, wherein the portion of the deposition tool through which the cleaning gas flows corresponds to a portion of a foreline exiting the deposition tool.

10. The cleaning-control subsystem of claim 9, further comprising:
    a heating component,
       wherein the heating component is configured to maintain a temperature of the portion of the foreline in a range of approximately 150 degrees Celsius to approximately 180 degrees Celsius.

11. The cleaning-control subsystem of claim 1, wherein the temperature sensor corresponds to a k-type thermocouple mounted to a portion of the deposition tool through which the cleaning gas flows.

12. A thin-film furnace, comprising:
    a deposition chamber;
    a foreline connected to a gas outlet of the deposition chamber;
    a non-dispersive infrared sensor mounted to the foreline;
    a thermocouple mounted to the foreline; and
    a controller configured to:
       activate a first dry-clean operation for a deposition tool, wherein the first dry-clean operation forms a first concentration of a chemical compound in a cleaning gas, and wherein the cleaning gas passes from the deposition chamber through the foreline,
       receive, from the non-dispersive infrared sensor, initial first data indicating the first concentration of the chemical compound in the cleaning gas,
       receive, from the thermocouple, initial second data indicating a temperature of the cleaning gas,
       determine, based on initial first data and the initial second data and using a machine learning model, a particular combination of a second concentration of the chemical compound formed in the cleaning gas and a second temperature of the cleaning gas indicates a level of cleanliness of the deposition tool,
       determine, based on determining the particular combination of the second concentration of the chemical compound formed in the cleaning gas and the second temperature of the cleaning gas indicates the level of cleanliness of the deposition tool, the first dry-clean operation is complete,
       activate a second dry-clean operation for the deposition tool,
       receive, during a second dry-clean operation for the deposition tool, subsequent first data, from the non-dispersive infrared sensor and indicating the second concentration of the chemical compound, and subsequent second data, from the thermocouple and indicating the second temperature of the cleaning gas,
       determine, based on the subsequent first data and the subsequent second data, that the level of cleanliness of the deposition tool has been reached,
       determine, based on determining that the level of cleanliness of the deposition tool has been reached, that the second dry-clean operation is complete, and
       deactivate, based on determining that the second dry-clean operation is complete, the second dry-clean operation.

13. The thin-film furnace of claim 12, wherein the chemical compound comprises silicon tetrafluoride.

14. The thin-film furnace of claim 12, wherein each of the first dry-clean operation and the second dry-clean operation comprises:
    an etching operation that uses a recipe to remove a buildup of a thin-film material from an injector nozzle of the thin-film furnace.

15. The thin-film furnace of claim 12, wherein each of the first dry-clean operation and second dry-clean operation comprises:
    an etching operation that uses a recipe to remove a buildup of a thin-film material from an interior surface of a chamber of the thin-film furnace.

16. A subsystem, comprising:
    a controller configured to:
       receive initial first data indicating a first concentration of a chemical compound formed in a cleaning gas during a first dry-clean operation for a deposition tool,
       receive initial second data indicating a temperature of the cleaning gas,
       determine, based on initial first data and the initial second data and using a machine learning model, a particular combination of a second concentration of the chemical compound formed in the cleaning gas and a second temperature of the cleaning gas indicates a level of cleanliness of the deposition tool,
       determine, based on determining the particular combination of the second concentration of the chemical compound formed in the cleaning gas and the second temperature of the cleaning gas indicates the level of cleanliness of the deposition tool, the first dry-clean operation is complete,
       receive, during a second dry-clean operation for the deposition tool, subsequent first data, indicating the second concentration of the chemical compound, and subsequent second data, indicating the second temperature of the cleaning gas,
       determine, based on the subsequent first data and the subsequent second data, that the level of cleanliness of the deposition tool has been reached,
       determine, based on the subsequent first data and the subsequent second data that the second dry-clean operation is complete, and deactivate, based on determining that the second dry-clean operation is complete, the second dry-clean operation.

17. The subsystem of claim 16, wherein the machine learning model correlates one or more historical operating conditions to a level of cleanliness.

18. The subsystem of claim 17, wherein the one or more historical operating conditions corresponds to a dry-clean recipe.

19. The subsystem of claim 16, wherein the level of cleanliness corresponds to an amount of a buildup of a thin-film material in or on an injector nozzle within the deposition tool.

20. The subsystem of claim 16, wherein the level of cleanliness corresponds to an amount of a buildup of a thin-film material on an interior surface of a chamber within the deposition tool.

* * * * *